(12) United States Patent
Kim et al.

(10) Patent No.: US 7,317,651 B2
(45) Date of Patent: Jan. 8, 2008

(54) ANTI-FUSE CIRCUIT AND ANTI-FUSING METHOD

(75) Inventors: Nam-Jong Kim, Yongin-si (KR); Young-Sun Min, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 22 days.

(21) Appl. No.: 11/443,307

(22) Filed: May 31, 2006

(65) Prior Publication Data
US 2006/0268646 A1 Nov. 30, 2006

(30) Foreign Application Priority Data
May 31, 2005 (KR) .................... 10-2005-0045974

(51) Int. Cl.
*G11C 17/16* (2006.01)

(52) U.S. Cl. .............. 365/225.7; 365/230.08; 365/189.11; 365/189.07; 365/189.09; 365/200

(58) Field of Classification Search ................ 365/200, 365/201, 225.7, 189.11, 189.06, 189.07, 189.09, 365/230.08
See application file for complete search history.

(56) References Cited

U.S. PATENT DOCUMENTS

| 5,604,694 | A | 2/1997 | Callahan .................... 365/96 |
| 5,631,862 | A | 5/1997 | Cutter et al. ................. 365/96 |
| 6,191,984 | B1* | 2/2001 | Noh ........................... 365/200 |
| 6,363,021 | B2* | 3/2002 | Noh ........................... 365/200 |
| 2006/0062060 | A1* | 3/2006 | Min et al. ................... 365/200 |
| 2006/0092729 | A1* | 5/2006 | Min et al. ................... 365/201 |
| 2006/0214261 | A1* | 9/2006 | You et al. ................... 257/530 |
| 2006/0268646 | A1* | 11/2006 | Kim et al. ................. 365/225.7 |

FOREIGN PATENT DOCUMENTS

| JP | 2002-134620 |   | 5/2002 |
| JP | 2006-216954 | * | 8/2006 |

* cited by examiner

*Primary Examiner*—Andrew Q. Tran
(74) *Attorney, Agent, or Firm*—Harness, Dickey & Pierce, P.L.C.

(57) ABSTRACT

An anti-fuse and an anti-fusing method are disclosed. An example embodiment of the present invention is directed to an anti-fuse circuit, including an anti-fuse receiving a first voltage, a pull-up transistor coupled between the anti-fuse and a first node, the pull-up transistor configured to pull up a voltage at the first node to the first voltage when the anti-fuse is in a given operation mode, a pull-down transistor configured to pull down the voltage at the first node to a second voltage in response to a pull-down control signal, the second voltage lower than the first voltage, a voltage level detector configured to compare a detection reference voltage level with a voltage level at the first node to generate a detection output signal and a pull-down control circuit configured to generate the pull-down control signal based on a fuse input signal and the detection output signal.

26 Claims, 6 Drawing Sheets

ANTI-FUSE CIRCUIT AND ANTI-FUSING METHOD

PRIORITY STATEMENT

This application claims priority under 35 USC § 119 to Korean Patent Application No. 2005-45974, filed on May 31, 2005, the contents of which are herein incorporated by reference in its entirety.

BACKGROUND OF THE INVENTION

1. Field of the Invention

Example embodiments of the present invention relate generally to an anti-fuse circuit and anti-fusing method, and more particularly to an anti-fuse circuit and anti-fusing method with an increased reliability.

2. Description of the Related Art

If even a single memory cell within a conventional semiconductor memory device functions improperly, the semiconductor memory device may be considered to be defective. However, if a relatively small number of memory cells are malfunctioning, it may not be efficient to treat the entire semiconductor memory device as being defective.

Therefore, one or more redundancy memory cells may be included within the semiconductor memory device. A redundancy memory cell may functionally take the place of a defective memory cell within the conventional semiconductor memory device. Accordingly, a semiconductor memory device with a redundancy memory cell employed in place of a defective memory cell may be treated as a non-defective or normal semiconductor memory device, thereby increasing a yield of semiconductor memory devices.

A repairing process using the redundancy memory cell may include replacing the defective memory cell with the redundancy memory cell by switching corresponding addresses. For example, if a defective memory cell is detected by a test after wafer processing, a corresponding address of the defective memory cell may be switched to an address of the redundancy memory cell. Therefore, signals addressed to an address of the defective memory cell may be transferred to the redundancy memory cell instead. Conventionally, anti-fuse circuits may be used so as to perform the above-described repairing process.

SUMMARY OF THE INVENTION

An example embodiment of the present invention is directed to an anti-fuse circuit, including an anti-fuse receiving a first voltage, a pull-up transistor coupled between the anti-fuse and a first node, the pull-up transistor configured to pull up a voltage at the first node to the first voltage when the anti-fuse is in a given operation mode, a pull-down transistor configured to pull down the voltage at the first node to a second voltage in response to a pull-down control signal, the second voltage lower than the first voltage, a voltage level detector configured to compare a detection reference voltage level with a voltage level at the first node to generate a detection output signal and a pull-down control circuit configured to generate the pull-down control signal based on a fuse input signal and the detection output signal.

Another example embodiment of the present invention is directed to an anti-fusing method, including applying a first voltage to an anti-fuse, pulling up a voltage at a first node to the first voltage when the anti-fuse is in a given operation mode, pulling down the voltage at the first node to a second voltage in response to a pull-down control signal, the second voltage lower than the first voltage, comparing a detection reference voltage with the voltage at the first node to generate a detection output signal and generating the pull-down control signal based on a fuse input signal and the detection output signal.

Another example embodiment of the present invention is directed to anti-fuse circuits capable of maintaining reliability of semiconductor elements and/or reducing programming time.

Another example embodiment of the present invention is directed to a method of anti-fusing capable of maintaining reliability of semiconductor elements and/or reducing programming time.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DESCRIPTION OF EXAMPLE EMBODIMENTS OF THE PRESENT INVENTION

Hereinafter, example embodiments of the present invention will be explained in detail with reference to the accompanying drawings.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular example embodiments and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
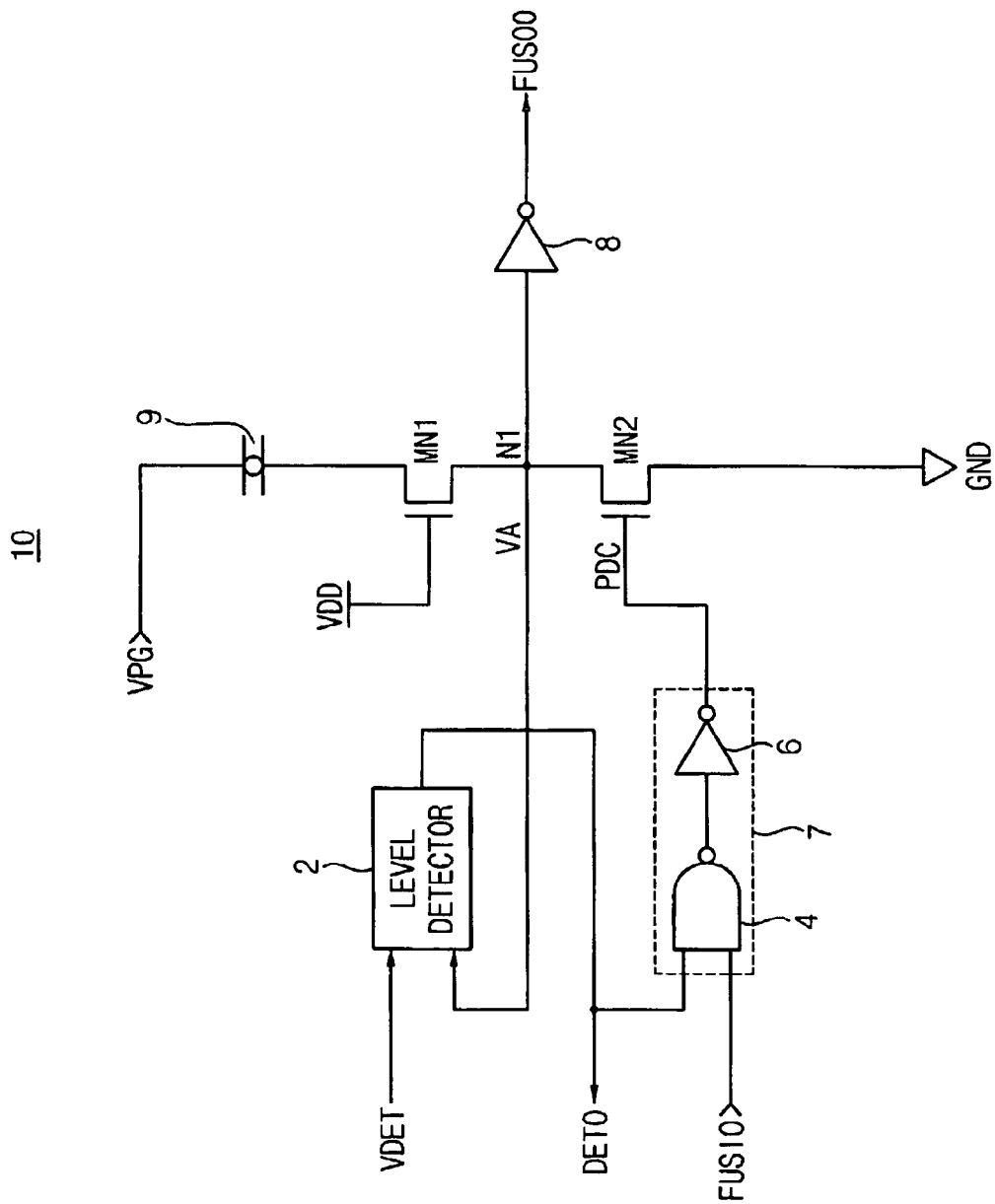
FIG. 1 is a circuit diagram illustrating an anti-fuse circuit according to an example embodiment of the present invention.

FIG. 1 is a circuit diagram illustrating an anti-fuse circuit 10 according to an example embodiment of the present invention.

In the example embodiment of FIG. 1, the anti-fuse circuit 10 may include an anti-fuse 9, a pull-up transistor MN1, a pull-down transistor MN2, a voltage level detector 2 and a pull-down control circuit 7. The anti-fuse circuit 10 may further include an inverter 8 for reversing voltage at a node N1.

In the example embodiment of FIG. 1, the anti-fuse 9 may have a first terminal coupled to a program voltage VPG. The pull-up transistor MN1 may be coupled between a second terminal of the anti-fuse 9 and the node N1. While the anti-fuse 9 is being programmed (i.e., operating in a programming mode), the anti-fuse 9 may electrically connect the node N1 to the program voltage VPG. The pull-down transistor MN2 may electrically connect the node N1 to a ground voltage GND in response to a pull-down control signal PDC. The voltage level detector 2 may compare a detection reference voltage VDET and a voltage VA at the node N1 to generate a detection output signal DETO. In an example, the detection output signal DETO may be set to a first voltage level (e.g., a higher voltage level) if the voltage VA at the node N1 is set to a lower voltage level (e.g., lower than the detection reference voltage VDET). Alternatively, in another example, the detection output signal DETO may be set to a second voltage level (e.g., a lower voltage level, a ground voltage, etc.) if the voltage VA at the node N1 is set to a higher voltage level (e.g., a higher voltage level than the detection reference voltage VDET). The pull-down control circuit 7 may perform an AND operation on a fuse input signal FUSI0 and the detection output signal DETO to generate the pull-down control signal PDC. A fuse output signal FUS00 may be an inverted version of the voltage VA at the node N1 as output by the inverter 8.

Figure 2:
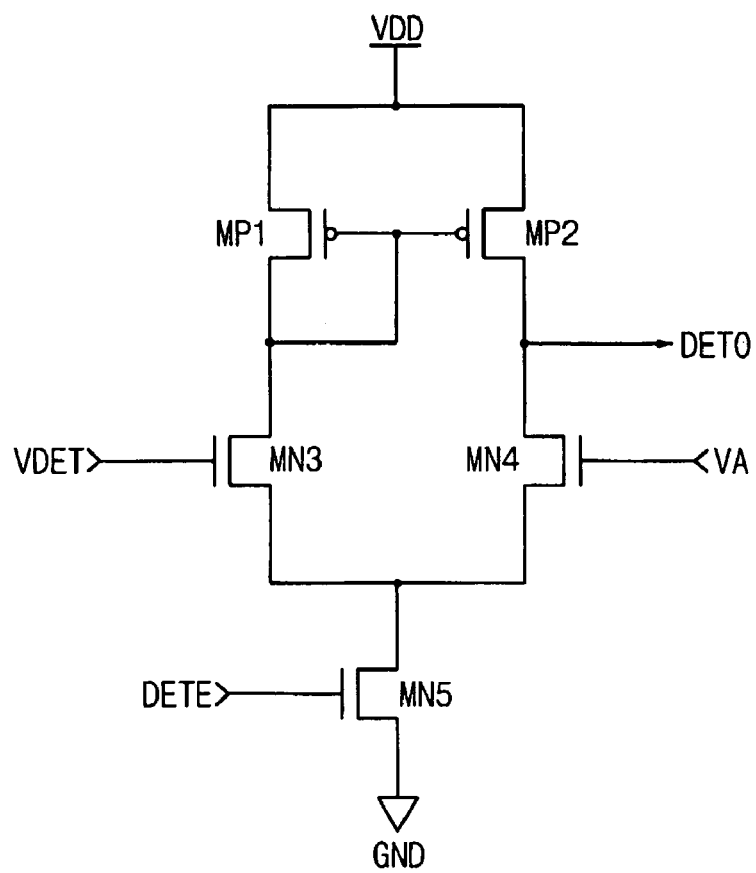
FIG. 2 is a circuit diagram illustrating an example embodiment of a voltage level detector in the anti-fuse circuit of FIG. 1.

FIG. 2 is a circuit diagram illustrating an example embodiment of a voltage level detector 2 in the anti-fuse circuit of FIG. 1.

In the example embodiment of FIG. 2, the voltage level detector 2 may include a first PMOS transistor MP1, a second PMOS transistor MP2, a first NMOS transistor MN3, a second NMOS transistor MN4 and a third NMOS transistor MN5.

In the example embodiment of FIG. 2, the first PMOS transistor MP1 may include a source coupled to a supply voltage VDD. The second PMOS transistor MP2 may include a source coupled to the supply voltage VDD and a gate coupled to a gate of the first PMOS transistor MP1. The first NMOS transistor MN3 may include a drain commonly coupled to the drain and gate of the first PMOS transistor MP1, and a gate receiving the detection reference voltage VDET. The second NMOS transistor MN4 may include a drain coupled to the drain of the second PMOS transistor MP2 and a gate receiving the voltage VA at the node N1. The third NMOS transistor MN5 may include a drain commonly coupled to the source of the first NMOS transistor MN3 and the source of the second NMOS transistor MN4, a gate receiving a detection enable signal DETE, and a source coupled to the ground voltage GND.

Example operation of the voltage level detector 2 of FIG. 2 will now be described in greater detail. In the example operation, the detection output signal DETO may be set to the second voltage level (e.g., a lower voltage level, a ground voltage, etc.) if the voltage VA at the node N1 is set to a higher voltage level (e.g., higher than the detection reference voltage VDET). In an alternative example, the detection output signal DETO may be set to the first voltage level (e.g., a higher voltage level) if the voltage VA at the node N1 is set to a lower voltage level (e.g., lower than the detection reference voltage VDET). In an example, the detection enable signal DETE may be maintained at an active or enabled state during an operation of the anti-fuse circuit 10 of FIG. 1.

Figure 3:
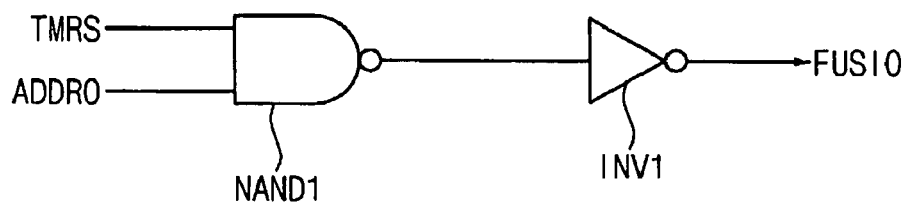
FIG. 3 is a circuit diagram illustrating a fuse input signal generating circuit according to another example embodiment of the present invention.

FIG. 3 is a circuit diagram illustrating a fuse input signal FUSI0 generating circuit 300 according to another example embodiment of the present invention. FIG. 1 illustrates a fuse input signal FUSI0 received by the pull-down control circuit 7. Accordingly, in an example, the fuse input signal FUSI0 generating circuit 300 may be the circuit which may generate the fuse input signal FUSI0.

In the example embodiment of FIG. 3, the fuse input signal FUSI0 generating circuit 300 may include a NAND gate NAND1 and an inverter INV1. The NAND gate NAND1 may perform a NAND operation on a mode register set signal TMRS and a single bit of an address signal ADDR0. The inverter INV1 may invert an output signal received from the NAND gate NAND1.

Example operations of the anti-fuse circuit 10 of FIG. 1 will now be described with reference to the example embodiments of FIGS. 1 through 3.

In example operation of FIGS. 1 through 3, the anti-fuse 9 may be embodied as a capacitor. The anti-fuse 9 may function as an open circuit before programming. After programming, the anti-fuse 9 may be "blown" so as to operate with a lower resistance. The detection reference voltage VDET, which may be received by the voltage level detector 2, may be received from an external source (e.g., not within the anti-fuse circuit 10 of FIG. 1). The detection reference voltage VDET may thereby be adjusted based on desired operational performance factors.

In example operation of FIGS. 1 through 3, the fuse input signal FUSI0 may be generated with a NAND operation performed on the mode register set signal TMRS and a single bit of the address signal. The pull-up transistor MN1 may be maintained at an active, "on" or enabled state because the supply voltage VDD may be applied to the gate of the pull-up transistor MN1. If the fuse input signal FUSI0 is set to the first voltage level (e.g., a higher voltage level or "1"), the pull-down control signal PDC may transition to the first voltage level (e.g., a higher voltage level or "1"), the pull-down transistor MN2 may be turned on and the node N1 may be electrically connected to the ground voltage GND.

In example operation of FIGS. 1 through 3, if the program voltage VPG (e.g., which may be set to a voltage level sufficient to program the anti-fuse 9) is applied to a terminal of the anti-fuse 9, the anti-fuse 9 may be "blown" and may thereafter operate with a lower resistance because higher voltages may be applied between respective terminals of the anti-fuse 9. In an example, when the programming of the anti-fuse 9 completes, the program voltage VPG may transition to the second voltage level (e.g., a lower voltage level or "0") and the voltage VA at the node N1 may transition to the second voltage level (e.g., a lower voltage level or "0"). The fuse output signal FUS00 may be an inverse version of the voltage VA at the node N1 by the inverter 8, which may accordingly transition to the first voltage level (e.g., a higher voltage level or "1").

In example operation of FIGS. 1 through 3, in a programming mode (e.g., when the anti-fuse 9 may be programmed), the voltage at the node N1 may be detected by the voltage level detector 2. If the voltage VA at the node N1 is detected and the anti-fuse 9 is being programmed, the pull-down transistor MN2 may be turned off, thereby reducing (e.g., removing) a conductive path of the node N1 through the ground voltage GND. Therefore, the pull-up transistor MN1 and the pull-down transistor MN2 may experience reduced damage based on the program voltage VPG. Accordingly, a reliability of a semiconductor device including the anti-fuse circuit 10 of FIG. 1 may be improved.

In example operation of FIGS. 1 through 3, the detection output signal DETO may be set to the second voltage level (e.g., a lower voltage level, a ground voltage, "0", etc.) if the voltage VA at the node N1 is set to a higher voltage level (e.g., higher than the detection reference voltage VDET). The detection output signal DETO may alternatively be set to the first voltage level (e.g., a higher voltage level or "1") if the voltage VA at the node N1 is set to a lower voltage level (e.g., lower than the detection reference voltage VDET). If the anti-fuse 9 has not yet been programmed, the voltage VA at the node N1 may be set to a lower level than that the detection reference voltage VDET, and the detection output signal DETO may be set to the first voltage level (e.g., a higher voltage level or "1"). The pulldown control signal PDC may transition to the first voltage level (e.g., a higher voltage level or "1") and the pull-down transistor MN2 may be maintained in an "on" (e.g., active, enabled, etc.) state so as to perform additional program operations.

In example operation of FIGS. 1 through 3, the detection output signal DETO may be outputted from the semiconductor device (e.g., including the anti-fuse circuit 10 of FIG. 1) and may be analyzed to assess a state of the programming of the anti-fuse 9. A result of the analysis of the detection output signal DETO may be used to determine programming parameters for next or future programming operations. In an example, if the result of the analysis is provided to anti-fuse programming devices and used to configure future programming steps of the anti-fuse 9, the programming time may be reduced.

Figure 4:
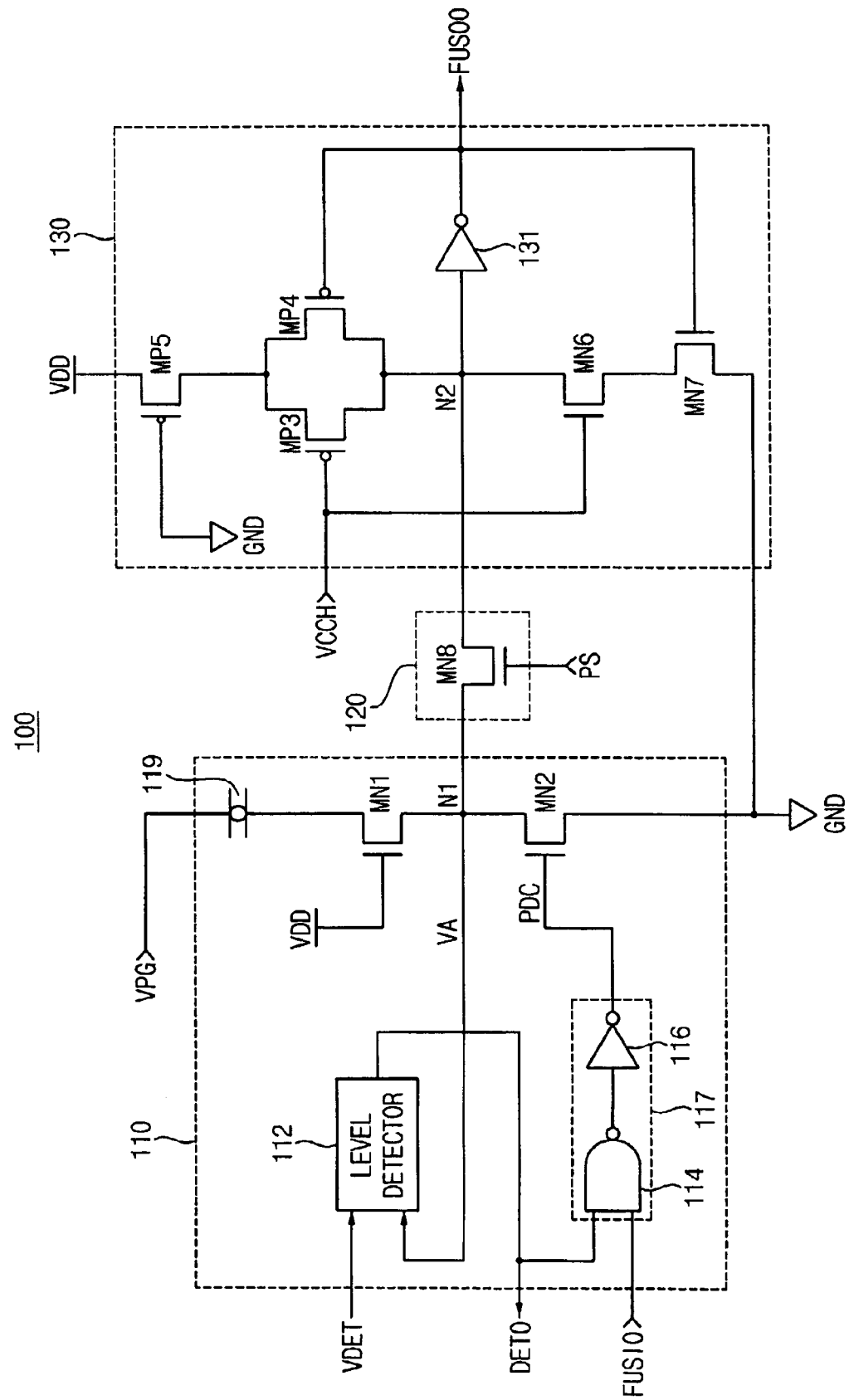
FIG. 4 is a circuit diagram illustrating an anti-fuse circuit according to another example embodiment of the present invention.

FIG. 4 is a circuit diagram illustrating an anti-fuse circuit 100 according to another example embodiment of the present invention.

In the example embodiment of FIG. 4, the anti-fuse circuit 100 may include an anti-fuse circuit 110, a decoupling circuit 120 and a latch circuit 130. The anti-fuse circuit 100 illustrated in FIG. 4 may be similar to the anti-fuse circuit 10 of FIG. 1. However, the anti-fuse circuit 100 of FIG. 4 may be configured differently and further includes the decoupling circuit 120 and the latch circuit 130.

In the example embodiment of FIG. 4, the anti-fusing circuit 110 may include an anti-fuse 119, a pull-up transistor MN1, a pull-down transistor MN2, a voltage level detector 112 and a pull-down control circuit 117.

In the example embodiment of FIG. 4, the anti-fuse 119 may include a first terminal receiving the program voltage VPG The pull-up transistor MN1 may be coupled between a second terminal of the anti-fuse 119 and the node N1. If the anti-fuse 119 is being programmed, the anti-fuse 119 may electrically connect the node N1 to the program voltage VPG The pull-down transistor MN2 may electrically connect the node N1 to a ground voltage GND in response to a pull-down control signal PDC. The voltage level detector 112 may compare a detection reference voltage VDET and a voltage VA at the node N1 to generate a detection output signal DETO.

In the example embodiment of FIG. 4, the detection output signal DETO may be set to the second voltage level (e.g., a lower voltage level or "0") if the voltage VA at the node N1 is set to a higher voltage level (e.g., higher than the detection reference voltage VDET). Alternatively, the detection output signal DETO may be set to the first voltage level (e.g., a higher voltage level or "1") if the voltage VA at the node N1 is set to a lower voltage level (e.g., lower than the detection reference voltage VDET). The pull-down control circuit 117 may perform an AND operation on the fuse input signal FUSI0 and the detection output signal DETO to generate the pull-down control signal PDC.

In the example embodiment of FIG. 4, the decoupling circuit 120 may be electrically connected between the node N1 and the node N2. The decoupling circuit 120 may electrically decouple the node N2 from the node N1 while the anti-fuse 119 is being programmed. In an example, the decoupling circuit 120 may include an NMOS transistor MN8 which may be maintained in an inactive or off state while the anti-fuse 119 is programmed and may thereafter (e.g., after programming of the anti-fuse 119 completes) be maintained in an active or on state. A control voltage PS may be received by the gate of the NMOS transistor MN8.

In the example embodiment of FIG. 4, the latch circuit 130 may latch signals of the node N2 and may generates the fuse output signal FUS00 to provide FUS00 to an output terminal of the fuse. The latch circuit 130 may include a first PMOS transistor MP5, a second PMOS transistor MP3, a third PMOS transistor MP4, an inverter 131, a first NMOS transistor MN6 and a second NMOS transistor MN7.

In the example embodiment of FIG. 4, the first PMOS transistor MP5 may include a source coupled to the supply voltage VDD and a gate coupled to the ground voltage GND. The second PMOS transistor MP3 may include a source coupled to the drain of the first PMOS transistor MP5, a gate receiving a power-up signal VCCH, and a drain coupled to the node N2. The third PMOS transistor MP4 may include a source coupled to the drain of the first PMOS transistor MP5, a gate coupled to the output terminal of the anti-fuse circuit 100, and a drain coupled to the node N2.

In the example embodiment of FIG. 4, the inverter 131 may include an input terminal coupled to the node N2, and an output terminal coupled to an output terminal of the anti-fuse circuit 100. The first NMOS transistor MN6 may include a drain coupled to the node N2, and a gate receiving the power-up signal VCCH. The second NMOS transistor MN7 may include a drain coupled to the source of the first NMOS transistor MN6, a gate coupled to the output terminal of the fuse, and a source coupled to the ground voltage GND.

Example operation of the anti-fuse circuit 100 of FIG. 4 will now be described. The anti-fuse circuit 100 of FIG. 4 may operate similar to the anti-fuse circuit 10 of FIG. 1 as described above, with the exception of the operation of the decoupling circuit 120 and the latch circuit 130, which will now be described in greater detail.

In example operation of the anti-fuse circuit 100 of FIG. 4, the decoupling circuit 120 may be maintained in an inactive or off state while the anti-fuse 119 is being programmed, and may thereafter (e.g., after the programming of the anti-fuse 119 is completed) be maintained in an active or on state. Accordingly, the decoupling circuit 120 may electrically decouple the node N1 and the node N2 until the programming of the anti-fuse 119 completes.

In example operation of the anti-fuse circuit 100 of FIG. 4, the latch circuit 130 may latch signals at the node N2 and may generate the fuse output signal FUS00 and may transfer the fuse output signal FUS00 to the output terminal of the anti-fuse circuit 100. The fuse output signal FUS00 may be maintained at the second voltage level (e.g., a lower voltage level or "0") until the power-up signal VCCH rises above a threshold voltage. The fuse output signal FUS00 may transition to the first voltage level (e.g., a higher voltage level or voltage "1") after the power-up signal VCCH rises above the threshold voltage. The fuse output signal FUS00 may further be an inverted version signal of a voltage at the node N2.

Figure 5:
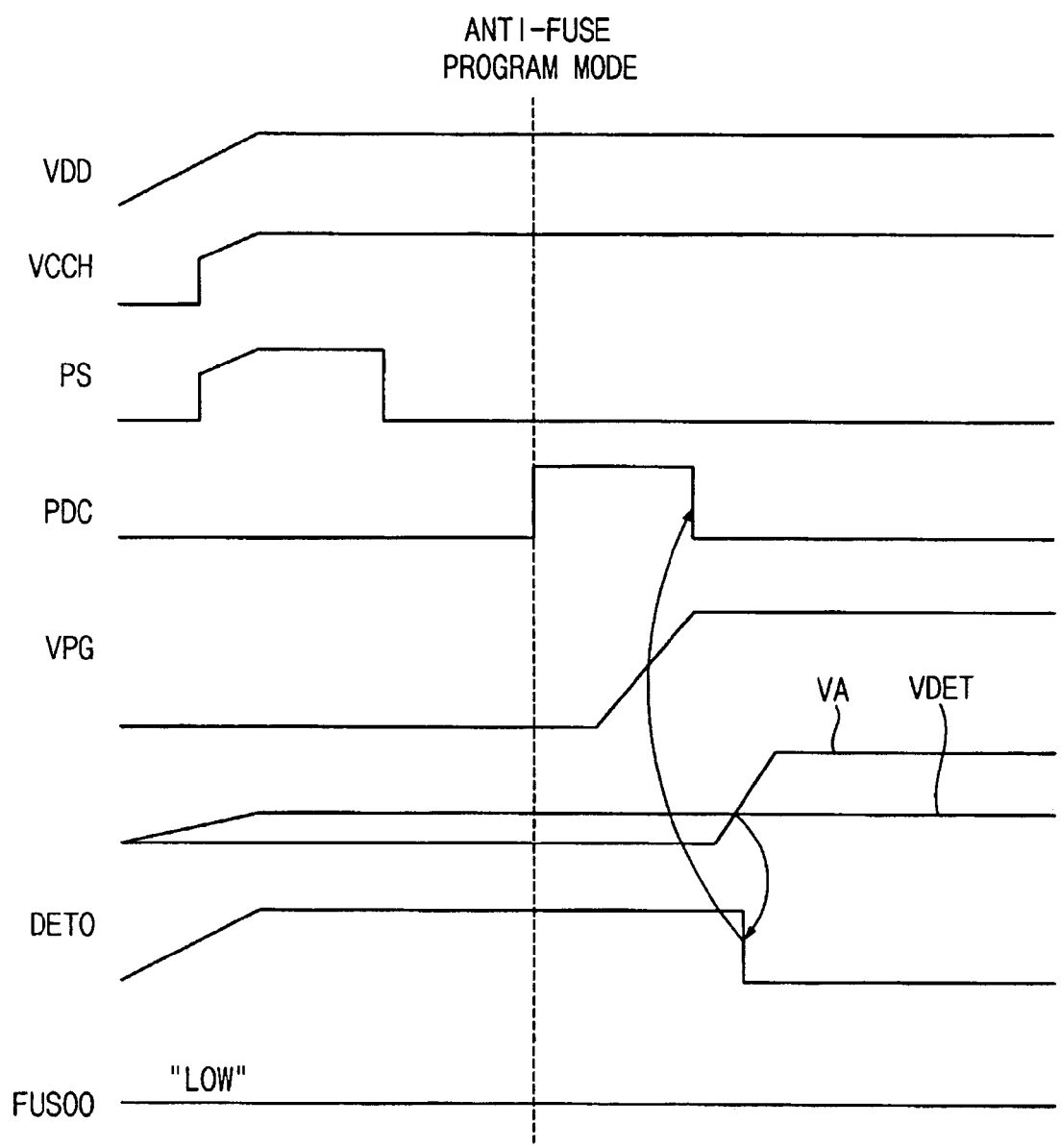
FIG. 5 is a timing diagram for the anti-fuse circuit of FIG. 4 during an anti-fuse program operation according to another example embodiment of the present invention.

FIG. 5 is a timing diagram for the anti-fuse circuit 100 of FIG. 4 during an anti-fuse program operation according to another example embodiment of the present invention.

In the example embodiment of FIG. 5, in the anti-fuse programming mode, if the voltage VA at the node N1 rises above the detection reference voltage VDET, the detection output signal DETO (e.g., output from the voltage level detector 112 of FIG. 4) may transition to the second voltage level (e.g., a lower voltage level or "0") from the first voltage level (e.g., a higher voltage level or "1"). The pull-down control signal PDC may also transition to the second voltage level (e.g., a lower voltage level or "0") from the first voltage level (e.g., a higher voltage level or "1"). Thereafter, the programming may be considered to be completed.

Figure 6:
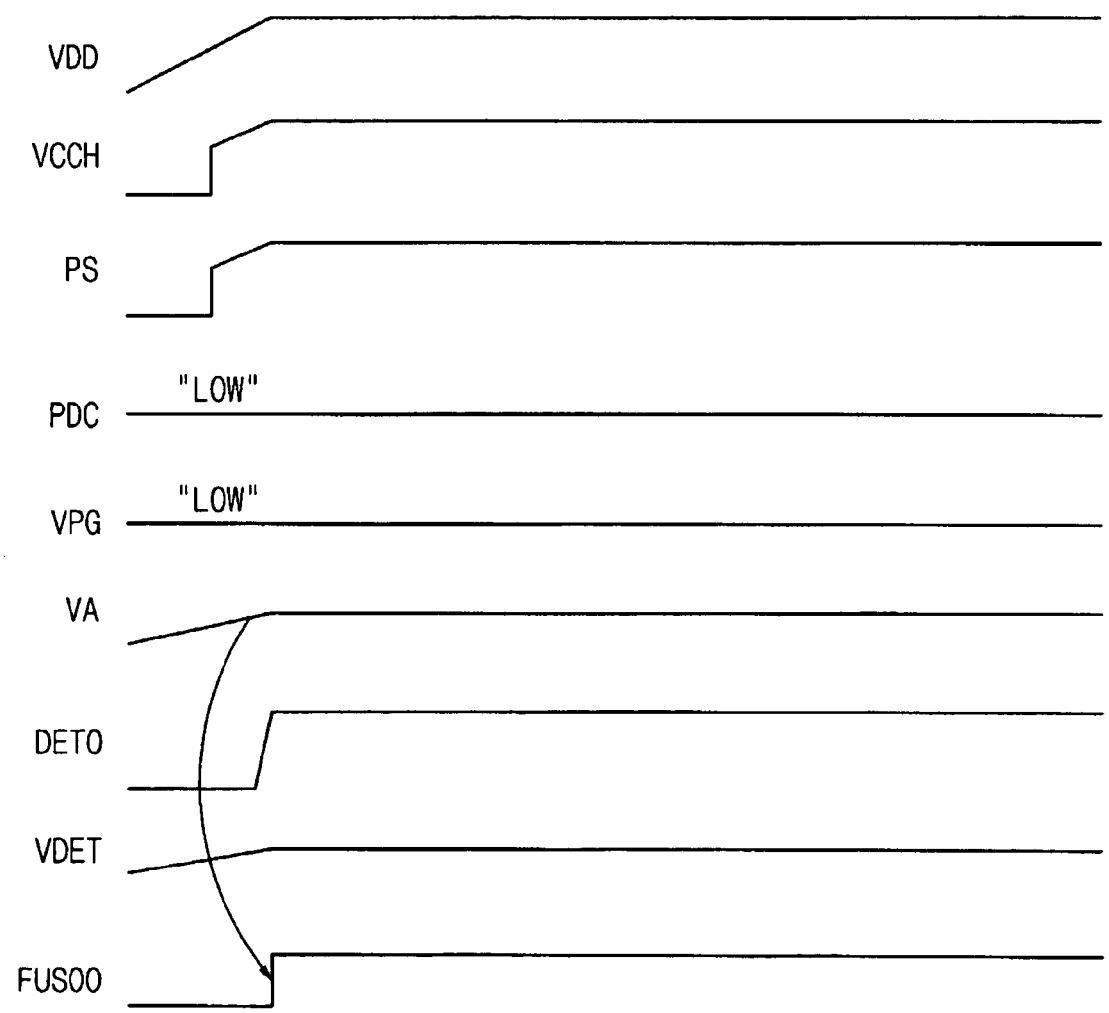
FIG. 6 is a timing diagram for the anti-fuse circuit of FIG. 4 after the anti-fuse program operation of FIG. 5 according to another example embodiment of the present invention.

FIG. 6 is a timing diagram for the anti-fuse circuit of FIG. 4 after the anti-fuse program operation of FIG. 5 according to another example embodiment of the present invention.

In the example embodiment of FIG. 6, if the control voltage PS (e.g., which may be applied to the gate of the NMOS transistor MN8) transitions to the first voltage level (e.g., a higher voltage level or "1"), the voltage VA at the node N1 may be maintained at the second voltage level (e.g., a lower voltage level or "0") and the fuse output signal FUS00 may transition to the first voltage level (e.g., a higher voltage level or "1"). Thereafter, the fusing operation may be considered to be completed.

Figure 7:
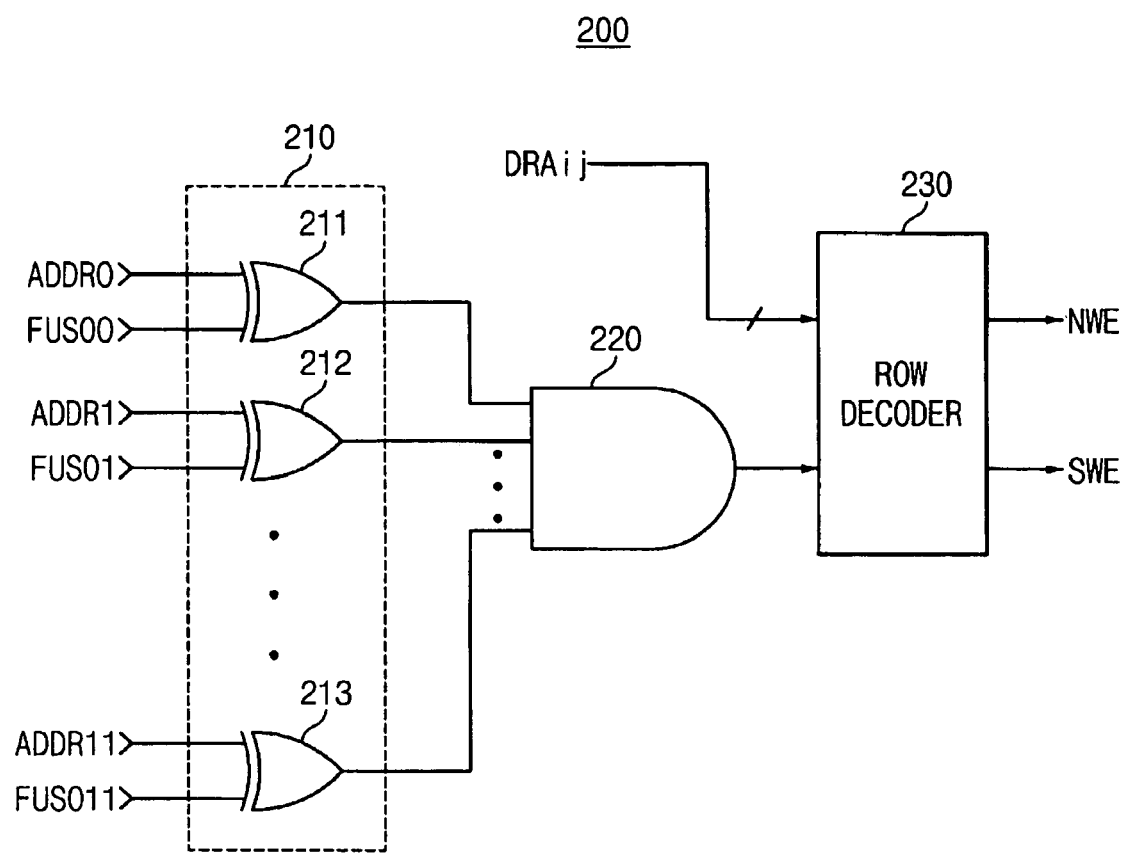
FIG. 7 is a circuit diagram illustrating a word line drive circuit according to another example embodiment of the present invention.

FIG. 7 is a circuit diagram illustrating a word line drive circuit 200 according to another example embodiment of the present invention.

In the example embodiment of FIG. 7, the word line drive circuit 200 may include a comparing circuit 210, an AND gate 220 and a row decoder 230. The comparing circuit 210 may include a plurality of exclusive OR (XOR) gates 211 through 213. As shown in FIG. 7, the comparing circuit 210 receives a plurality of fuse output signals FUS00 through FUS011. In an example, the fuse output signals FUS00 through FUS011 may be generated by a plurality of anti-fuse circuits, such as anti-fuse circuit 10 of FIG. 1 and/or anti-fuse circuit 100 of FIG. 4.

In the example embodiment of FIG. 7, the comparing circuit 210 may compare bits of address signals ADDR0 through ADDR11 with fuse output signals FUS00 through FUS011, respectively, which correspond to the bits of the address signals ADDR0 through ADDR11. If the address bit ADDR0 is equal to the fuse output signal FUS00, the output of the XOR gate 211 may be set to the first voltage level (e.g., a higher voltage level or "1"). Alternatively, if the address bit ADDR0 is different than the fuse output signal FUS00, the output of the XOR gate 211 may be set to the second voltage level (e.g., a lower voltage level or "0").

In the example embodiment of FIG. 7, the AND gate 220 may perform AND operations on the output signals of the comparing circuit 210. The row decoder 230 may decode the output signal of the AND gate 220 and decoded row address signals DRAij to generate a word line enable signal NWE and a spare word line enable signal SWE.

Example operation of the word line drive circuit 200 of FIG. 7 will now be described in greater detail.

In example operation of the word line drive circuit 200 of FIG. 7, the word line drive circuit 200 such as FIG. 7 may be configured for operation with one or more anti-fuse circuits illustrated in FIG. 1 and/or FIG. 4. For example, as shown in FIG. 7, fuse output signals FUS00 through FUS011 may be generated using twelve anti-fuse circuits, and these fuse output signals FUS00 through FUS011 may be received and compared by the comparing circuit 210.

In example operation of the word line drive circuit 200 of FIG. 7, if all of the output signals from each of the exclusive OR gates configuring the comparing circuit 210 are set to the first voltage level (e.g., a higher voltage level or "1"), the output signal of the AND gate 220 may also be set to the first voltage level (e.g., a higher voltage level or "1"). Accordingly, the spare word line enable signal SWE (e.g., which may be output by the row decoder 230) may be enabled (e.g., set to an active/on state, set to the first voltage level, etc.).

In example operation of the word line drive circuit 200 of FIG. 7, the row decoder 230 may decode the decoded row address signals DRAij to generate the word line enable signal when a semiconductor memory device including the word line drive circuit 200 may be in a normal operation mode (e.g., not a programming mode). If a defective cell of memory cells within the semiconductor memory device is detected, the spare word line enable signal SWE may be enabled by transitioning the fuse output signal of the respective anti-fuse circuit to the first voltage level (e.g., a higher voltage level or "1"). A word line corresponding to the redundancy memory cell may then be activated instead of the defective cell. Accordingly, it will be appreciated by one of ordinary skill in the art that a yield of a semiconductor memory device may be improved because the redundancy memory cell may be substituted for a defective memory cell such that the semiconductor memory device may be treated as a non-defective unit.

Example embodiments of the present invention being thus described, it will be obvious that the same may be varied in many ways. For example, while the above-described example embodiments include references to the first and second voltage levels, in one example the first voltage level may refer to a higher voltage level and the second voltage level may refer to a lower voltage level. Alternatively, in another example, the first voltage level may refer to a lower voltage level and the second voltage level may refer to a higher voltage level.

Such variations are not to be regarded as departure from the spirit and scope of example embodiments of the present invention, and all such modifications as would be obvious to one skilled in the art are-intended to be included within the scope of the following claims.

What is claimed is:

1. An anti-fuse circuit, comprising:
   an anti-fuse receiving a first voltage;
   a pull-up transistor coupled between the anti-fuse and a first node, the pull-up transistor configured to pull up a voltage at the first node to the first voltage when the anti-fuse is in a given operation mode;
   a pull-down transistor configured to pull down the voltage at the first node to a second voltage in response to a pull-down control signal, the second voltage lower than the first voltage;
   a voltage level detector configured to compare a detection reference voltage level with a voltage level at the first node to generate a detection output signal; and
   a pull-down control circuit configured to generate the pull-down control signal based on a fuse input signal and the detection output signal.

2. The anti-fuse circuit of claim 1, wherein the first voltage is a program voltage and the second voltage is a supply voltage.

3. The anti-fuse circuit of claim 1, wherein the given operation mode is a programming mode.

4. The anti-fuse circuit of claim 1, wherein the pull-down control signal indicates whether or not the anti-fuse circuit is in the given operation mode.

5. The anti-fuse circuit of claim 1, wherein the pull-down control circuit includes an AND gate performing an AND operation on the fuse input signal and the detection output signal.

6. The anti-fuse circuit of claim 1, wherein the detection reference voltage is received from an external source.

7. The anti-fuse circuit of claim 1, wherein the detection output signal is set to a first voltage level when the voltage at the first node is higher than the detection reference voltage, and the detection output signal is set to a second voltage level when the voltage at the first node is lower than the detection reference voltage.

8. The anti-fuse circuit of claim 7, wherein the pull-up transistor has a gate coupled to a supply voltage.

9. The anti-fuse circuit of claim 7, wherein the first voltage level is lower than the second voltage level.

10. The anti-fuse circuit of claim 1, further comprising:
    an inverter configured to invert the voltage at the first node.

11. The anti-fuse circuit of claim 1, wherein the voltage level detector includes:
    a first PMOS transistor having a source coupled to a first supply voltage;
    a second PMOS transistor having a source coupled to the first supply voltage, and a gate coupled to a gate of the first PMOS transistor;
    a first NMOS transistor having a drain commonly coupled to a drain and the gate of the first PMOS transistor, and a gate to which the detection reference voltage is applied;
    a second NMOS transistor having a drain coupled to a drain of the second PMOS transistor, and a gate to which the voltage at the first node is applied; and
    a third NMOS transistor having a drain commonly coupled to a source of the first NMOS transistor and a source of the second NMOS transistor, and a gate to which a detection enable signal is applied, and a source coupled to a second supply voltage.

12. The anti-fuse circuit of claim 1, wherein the fuse input signal is generated by performing an AND operation on a mode register set signal and a single bit of an address signal.

13. The anti-fuse circuit of claim 1, further comprising:
    a decoupling circuit coupled between the first node and a second node, the decoupling circuit configured to electrically decouple the second node from the first node while the anti-fuse operates in accordance with the given operation mode; and
    a latch circuit configured to latch a signal of the second node, the latch circuit further configured to generate a fuse output signal.

14. The anti-fuse circuit of claim 13, wherein the decoupling circuit includes a switching circuit which electrically decouples the second node from the first node while the anti-fuse operates in accordance with the given operation mode and electrically couples the second node to the first node while the anti-fuse does not operate in accordance with the given operation mode.

15. The anti-fuse circuit of claim 13, wherein the decoupling circuit includes a MOS transistor which is turned off while the anti-fuse operates in accordance with the given operation mode and is turned on while the anti-fuse does not operate in accordance with the given operation mode.

16. The anti-fuse circuit of claim 13, wherein the fuse output signal is an inverted version of the signal at the second node.

17. The anti-fuse circuit of claim 13, wherein the latch circuit maintains an output signal of the latch circuit at first voltage level until a power-up signal rises above a threshold voltage level and then transitions the output signal of the latch circuit to a second voltage level, the second voltage level higher than the first voltage level.

18. The anti-fuse circuit of claim 13, wherein the latch circuit comprises:
    a first PMOS transistor having a source coupled to a first supply voltage, and a gate coupled to a second supply voltage;
    a second PMOS transistor having a source coupled to a drain of the first PMOS transistor, a gate to which the power-up signal is applied, and a drain coupled to the second node;
    a third PMOS transistor having a source coupled to the drain of the first PMOS transistor, a gate coupled to the output terminal of the anti-fuse circuit and a drain coupled to the second node;
    an inverter having an input terminal coupled to the second node, and an output terminal coupled to the output terminal of the anti-fuse circuit;
    a first NMOS transistor having a drain coupled to the second node, and a gate to which the power-up signal is applied; and
    a second NMOS transistor having a drain coupled to a source of the first NMOS transistor, a gate coupled to the output terminal of the anti-fuse, circuit and a source coupled to the second supply voltage.

19. The anti-fuse circuit of claim 1, wherein the anti-fuse circuit is one of a plurality of anti-fuse circuits included within a word line drive circuit.

20. An anti-fusing method performed with the anti-fuse circuit of claim 1.

21. An anti-fusing method, comprising:
    applying a first voltage to an anti-fuse;
    pulling up a voltage at a first node to the first voltage when the anti-fuse is in a given operation mode;

pulling down the voltage at the first node to a second voltage in response to a pull-down control signal, the second voltage lower than the first voltage;

comparing a detection reference voltage with the voltage at the first node to generate a detection output signal; and generating the pull-down control signal based on a false input signal and the detection output signal.

22. The method of claim 21, wherein the first voltage is a program voltage and the second voltage is a supply voltage.

23. The method of claim 21, wherein the given operation mode is a programming operation mode.

24. The method of claim 21, wherein the pull-down control signal is generated at least in part by performing an AND operation on the fuse input signal and the detection output signal.

25. The method of claim 21, wherein the detection output signal is set to a first voltage level when the voltage at the first node is higher than the detection reference voltage, and the detection output signal is set to a second voltage level when the voltage at the first node is lower than the detection reference voltage.

26. The method of claim 21, further comprising:

latching a signal of a second node and generating a fuse output signal; and electrically decoupling the second node from the first node while the anti-fuse operates in accordance with the given operation mode.

* * * * *